(12) United States Patent
Yamamoto et al.

(10) Patent No.: US 6,596,968 B2
(45) Date of Patent: Jul. 22, 2003

(54) METHOD OF PRODUCING THROUGH-HOLE IN AROMATIC POLYIMIDE FILM

(75) Inventors: Tomohiko Yamamoto, Yamaguchi (JP); Katsumi Kato, Yamaguchi (JP); Toshinori Hosoma, Yamaguchi (JP); Shuichi Hashiguchi, Tokyo (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 09/941,890

(22) Filed: Aug. 28, 2001

(65) Prior Publication Data

US 2002/0023906 A1 Feb. 28, 2002

(30) Foreign Application Priority Data

Aug. 28, 2000 (JP) .................................. 2000-257694

(51) Int. Cl.[7] .............................................. B23K 26/40
(52) U.S. Cl. ................................................ 219/121.71
(58) Field of Search ........................ 219/121.71, 121.7, 219/121.69, 121.68, 121.67, 121.6; 430/311, 312, 316, 317, 314; 29/852, 831, 847; 428/156, 131, 209, 306.6, 307.3; 361/750, 762

(56) References Cited

U.S. PATENT DOCUMENTS 6,121,553 A * 9/2000 Shinada et al. ............. 174/259
6,156,870 A * 12/2000 Morita et al. ............... 528/353
6,254,971 B1 * 7/2001 Katayose et al. ........... 428/209
6,428,942 B1 * 8/2002 Jiang et al. ................. 430/312
6,492,252 B1 * 12/2002 Lin et al. .................... 438/612

* cited by examiner

*Primary Examiner*—M. Alexandra Elve
*Assistant Examiner*—Jonathan Johnson
(74) *Attorney, Agent, or Firm*—Reed Smith LLP

(57) ABSTRACT

A polyimide film favorably employable in a method of producing a through-hole in an aromatic-polyimide film having on its surface a laminated or deposited metal film by applying laser beam onto the polyimide film, preferably is composed of a high Tg aromatic polyimide layer which has a Tg of 300° C. or higher or has no noticeable Tg and is produced from a biphenyltetracarboxylic acid compound and an aromatic diamine compound and a low Tg aromatic polyimide layer which has a Tg of lower than 375° C. but higher than 200° C., provided that the Tg of the low Tg polyimide layer is lower than the Tg of the high Tg polyimide layer and the metal film is laminated or deposited on the surface of the low Tg polyimide layer on the side not facing the high Tg polyimide layer.

18 Claims, 2 Drawing Sheets

METHOD OF PRODUCING THROUGH-HOLE IN AROMATIC POLYIMIDE FILM

CROSS-REFERENCE TO RELATED APPLICATIONS

This application claims priority of Japanese application No. 2000-257694 filed Aug. 28, 2000, the complete disclosure of which is hereby incorporated by reference.

FIELD OF THE INVENTION

The present invention relates to a method of producing through-holes in an aromatic polyimide film having on its surface a laminated or deposited metal film.

BACKGROUND OF THE INVENTION

Aromatic polyimide films show good high temperature resistance, good chemical properties, high electrical insulating property, and high mechanical strength, and therefore are widely employed in a variety of technical fields. For instance, an aromatic polyimide film is favorably employable in the form of a continuous aromatic polyimide film/metal film composite sheet for manufacturing a flexible printed circuit board (FPC), a carrier tape for tape-automated-bonding (TAB), and a tape of lead-on-chip (LOC) structure.

The aromatic polyimide film/metal film composite sheet can be produced by bonding a polyimide film to a metal film using a conventional adhesive such as an epoxy resin. However, due to low heat-resistance of the conventional adhesive, the produced composite sheet cannot show satisfactory high heat-resistance.

For obviating the above-mentioned problem, a variety of bonding methods have been proposed. For instance, an aromatic polyimide film/metal film composite sheet is manufactured by producing a copper metal film on an aromatic polyimide film by electroplating or vacuum deposition. Otherwise, an aromatic polyamide acid solution (i.e., a solution of a precursor of an aromatic polyimide resin) is coated on a copper film, dried, and heated to a high temperature for producing an aromatic polyimide film on the copper metal film.

An aromatic polyimide film/metal film composite sheet also can be produced using an intermediate thermoplastic polyimide layer which is arranged between the polyimide film and the metal film.

A flexible printed circuit board (FPC) is generally provided with a number of through-holes for electrically connecting a circuit on one side and a circuit on another side. Heretofore, the through-holes have been provided in an aromatic polyimide film by a punching procedure. The punching is appropriate for providing a through-hole having a diameter of 500 μm or more. Due to the recent development of electronic devices, however, it is required that the flexible printed circuit boards or other electronic devices have through-holes having a less diameter such as 300 μm or less.

Japanese Patent Publication H7-109836 describes that a tape carrier composed of a metal conductive layer and a polyimide resin layer is etched on its polyimide resin layer using a laser beam of ultraviolet ray region (400 nm or shorter). In the working examples, the tape carrier is composed of a copper foil of 35 μm thick and a polyimide resin layer of 50 μm thick which is directly produced on the foil.

According to the study of the present inventors, it has now been discovered that commercially available aromatic polyimide film/metal film composite sheets are not appropriate for producing through-holes therein utilizing the laser etching procedure. For instance, a representative commercially available aromatic polyimide film/metal film composite is manufactured by coating a solution of a polyimide precursor (i.e., polyamide acid) on a metal film and subsequently heating the coated metal film to convert the polyimide precursor into a polyimide. In this procedure, the heating is performed at not so high temperatures, so as to not deteriorate the metal film by the heating. Accordingly, an employable polyimide precursor is limited to that capable of being turned into polyimide at a relatively low temperature. According to the study of the inventors, the polyimide manufactured from the polyimide precursor capable of being turned into polyimide at a relatively low temperature cannot give through-holes of good conditions concerning the smoothness of the inner surface of the through-hole and the shape of the through-hole.

For instance, the through-hole produced in the polyimide film which is prepared from a polyimide precursor capable of being turned into polyimide at a relatively low temperature is liable to have a cracked inner surface having a section illustrated in FIG. 1-(1) in which each of 11 and 13 stands for a metal film and 12 stands for a polyimide film. The through-hole 14 having cracked inner surface is turned into a through-hole having varying diameters after it is subjected to desmear processing, as illustrated in FIG. 1-(2).

SUMMARY OF THE INVENTION

It is an object of the invention to provide an improvement of a method of producing a through-hole in an aromatic polyimide film having on its surface a laminated or deposited metal film by applying a laser beam onto the polyimide film.

The present invention resides in a method of producing a through-hole in an aromatic polyimide film having on a surface thereof a laminated or deposited metal film by applying laser beam onto the polyimide film, which is characterized that the polyimide film comprises a high Tg aromatic polyimide layer which has a glass transition temperature of 300° C. or higher or has no noticeable glass transition temperature and is produced from a biphenyltetracarboxylic acid compound and an aromatic diamine compound and a low Tg aromatic polyimide layer which has a glass transition temperature of lower than 375° C. but higher than 200° C., provided that the glass transition temperature of the low Tg polyimide layer is lower than the glass transition temperature of the high Tg polyimide layer and the metal film is laminated or deposited on the surface of the low Tg aromatic polyimide layer on the side not facing the high Tg aromatic polyimide layer.

The invention further resides in a method of producing a through-hole in an aromatic polyimide film having on a surface thereof a laminated or deposited metal film by applying a laser beam onto the polyimide film, which is characterized in that the polyimide film comprises a high Tg aromatic polyimide layer which has a glass transition temperature of 300° C. or higher or has no noticeable glass transition temperature and is produced from a biphenyltetracarboxylic acid compound and an aromatic diamine compound and two low Tg aromatic polyimide layers each of which has a glass transition temperature of lower than 375° C. but higher than 200° C., provided that the glass transition temperature of the low Tg polyimide layer is lower than the glass transition temperature of the high Tg polyimide layer and the high Tg polyimide layer is placed between the low Tg polyimide layers.

DETAILED DESCRIPTION OF THE INVENTION

The aromatic polyimide film fixed to a metal film according to the invention can be composed of two polyimide layers, namely, a high Tg polyimide layer and a relatively low Tg polyimide layer, and is preferably composed of three polyimide layers, namely, a relatively low Tg polyimide layer, a high Tg polyimide layer, and a relatively low Tg polyimide layer. Tg stands for glass transition temperature.

Figure 3:
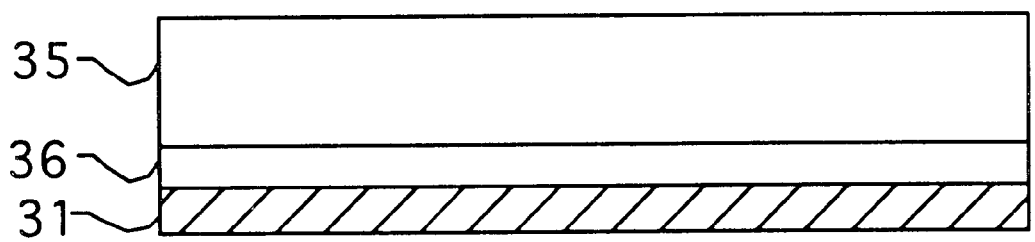
FIG. 3 is a schematic view of section of an aromatic polyimide film arranged on a metal film according to the invention.
Figure 4:
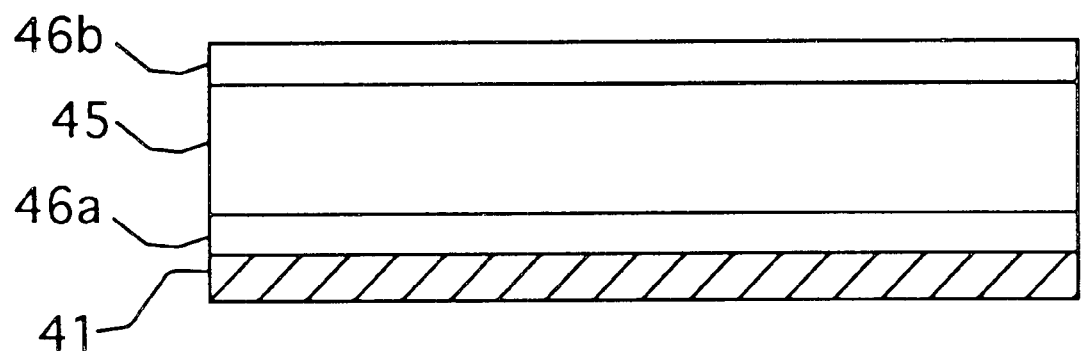
FIG. 4 is a schematic view of section of another aromatic polyimide film arranged on a metal film according to the invention.

FIG. 3 illustrates the two polyimide layer structure (high Tg layer 35 and low Tg layer 36) placed and fixed on a metal film 31, while FIG. 4 illustrates the three polyimide layer structure (high Tg layer 45, low Tg layers 46a, 46b) placed and fixed on a metal film 41.

Figure 1:
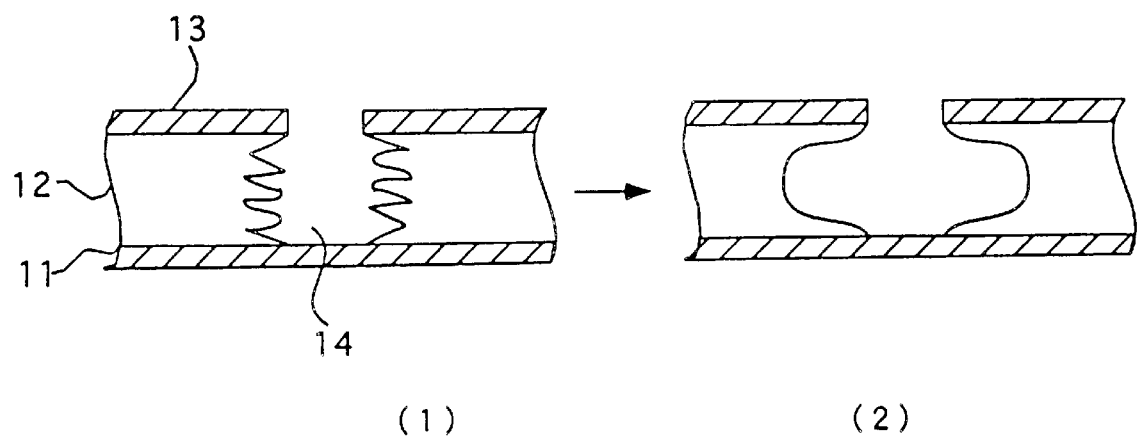
FIG. 1-(1) and -(2) are schematic views of section of a through-hole provided in a commercially available aromatic polyimide-film arranged on a metal film, in which (1) indicates a view observed just after laser etching and (2) indicates a view observed after desmear processing.
Figure 2:
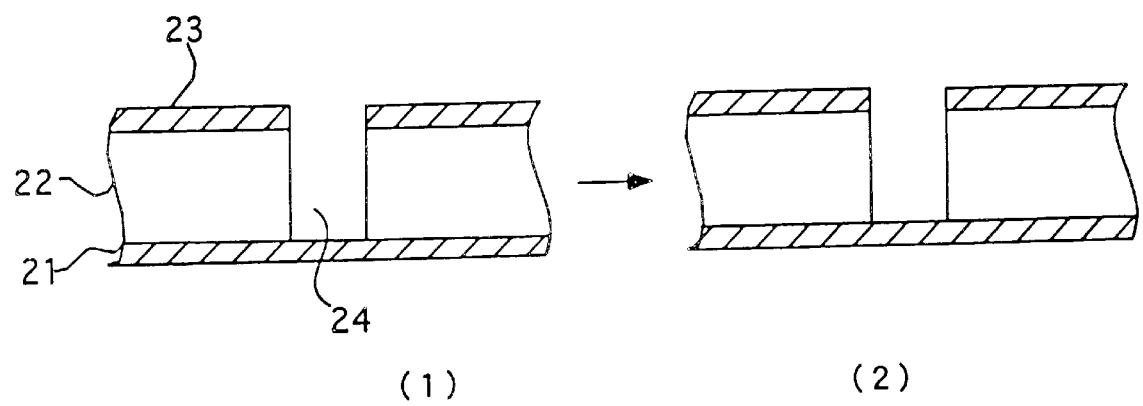
FIG. 2-(1) and -(2) are schematic views of section of a through-hole provided in an aromatic polyimide film arranged on a metal film according to the invention, in which (1) indicates a view observed just after laser etching and (2) indicates a view observed after desmear processing.

Any of the polyimide layer structures of the invention having the structures of FIG. 3 and FIG. 4 can give a through-hole having a smooth inner surface and good hole shape by laser etching, as illustrated in FIG. 2-(1) in which each of 21 and 23 stands for a metal film, and 22 stands for a polyimide film. The through-hole of FIG. 2-(1) can keep its smooth inner surface and good hole shape even after it is subjected to desmear processing, as is illustrated in FIG. 2-(2).

Examples of the metal films include copper films (rolled copper film and electrolytic copper film), stainless steel films, aluminum films, gold films, and metal alloy films. The metal film generally has a thickness of less than 35 $\mu$m, preferably in the range of 1 to 18 $\mu$m, more preferably 3 to 12 $\mu$m. The metal film preferably has a surface roughness (Rz) of less than 3 $\mu$m, more preferably in the range of 0.5 to 3 $\mu$m, most preferably 1.5 to 3 $\mu$m. A copper film having such preferred surface roughness is commercially available as VLP, LP, or HTE.

The metal film may be formed on the polyimide film by chemical plating, vacuum deposition, or other depositing methods.

The aromatic polyimide film of the invention can be composed of a high Tg polyimide layer and a relatively low Tg polyimide layer. The relatively low Tg polyimide layer generally is thermoplastic and placed between the high Tg polyimide layer and the metal film. Another relatively low Tg polyimide layer can be attached to the high Tg polyimide layer on another side. On the latter relatively low Tg polyimide layer can be placed another metal film.

The aromatic polyimide film preferably has a thickness of 7 to 50 $\mu$m, more preferably 7 to 25 $\mu$m. The high Tg polyimide layer preferably has a thickness of 55 to 99.9% of the thickness of the polyimide film. The high Tg polyimide layer preferably has a thickness of 50 $\mu$m or less, more preferably 5 to 40 $\mu$m, most preferably 5 to 20 $\mu$m. The low Tg polyimide layer preferably has a thickness of 0.03 to 10 $\mu$m.

The aromatic polyimide film preferably has a modules in tension of 400 to 1,000 kgf/mm$^2$.

The high Tg aromatic polyimide layer preferably has a coefficient of linear expansion of $5 \times 10^{-6}$ to $25 \times 10^{-6}$ cm/cm/°C. in the temperature range of 50 to 200° C., in both a machine direction thereof and a traverse direction thereof.

For the preparation of the high Tg aromatic polyimide film, one of the following combinations are preferably employed:

3,3',4,4'-biphenyltetracarboxylic dianhydride (s-BPDA) and p-phenylenediamine (PPD);

3,3',4,4'-biphenyltetracarboxylic dianhydride and a combination of p-phenylenediamine (PPD) and 4,4'-diaminodiphenyl ether (DADE);

a combination of 3,3'1,4,41-biphenyltetracarboxylic dianhydride (s-BPDA) and pyromellitic dianhydride (PMDA) and p-phenylenediamine, provided that the ratio of the s-BPDA to PMDA, i.e., s-BPDA/PMDA, is 15/85 or more, preferably 50/50 or more; and a combination of 3,3',4,4'-biphenyltetracarboxylic dianhydride (s-BPDA) and pyromellitic dianhydride (PMDA) and a combination of p-phenylenediamine (PPD) and 4,4'-diaminodiphenyl ether (DADE), provided that the ratio of s-BPDA to PMDA, i.e., s-BPDA/PMDA, is 15/85 or more, preferably 50/50 or more.

In the above-mentioned combinations, PPD and DADE are preferably employed at a ratio of more than 10/90 (PPD/DADE), more preferably at a ratio of more than 85/15 (PPD/DADE).

The above-mentioned combinations may further contain other aromatic tetracarboxylic dianhydride and other aromatic diamines (e.g., 4,4'-diaminodiphenylmethane), under the condition that the incorporation of these additional compounds does not alter the high glass temperature of the high Tg polyimide layer.

The (relatively) low Tg aromatic polyimide layer which is thermoplastic and/or flexible, preferably has a glass transition temperature (Tg) of 200 to 375° C., more preferably 200 to 300° C., most preferably 200 to 275° C., so as to fix the low Tg aromatic polyimide layer to a metal layer under pressure at a temperature in the range of 300 to 400° C. The glass transition temperature of the high Tg polyimide layer preferably is higher than the glass transition temperature of the low Tg polyimide layer by 10° C. or larger.

Moreover, the low Tg aromatic polyimide layer preferably does not become liquid at a temperature of 300° C. or lower, and preferably has a modules of elasticity at 257° C. of 0.0002 to 0.2, as compared with a modules of elasticity at 50° C.

For the preparation of the low Tg aromatic polyimide film, one of the following combinations are preferably employed:

2,3,3',4-biphenyltetracarboxylic dianhydride (a-BPDA) and 1,3-bis(4-aminophenoxy)benzene (TPER);

4,4'-oxydiphthalic dianhydride (ODPA) and 1,3-bis(4-aminophenoxy)-2,2-dimethylpropane (DANPG);

pyromellitic dianhydride (PMDA) and 1,3-bis(4-aminophenoxy)benzene (TPER);

3,3',4,4'-benzophenonetetracarboxylic dianhydride and 1,3-bis(3-aminophenoxy)benzene;

3,3',4,4'-benzophenonetetracarboxylic dianhydride and a combination of 3,3'-diaminobenzophenone and 1,3-bis(3-aminophenoxy)benzene; and 3,3',4,4'-biphenyltetracarboxylic dianhydride (s-BPDA) and 4,4'-diaminodiphenyl ether.

In the above-mentioned combinations of an aromatic tetracarboxylic anhydride and an aromatic diamine for the preparation of the low Tg polyimide layer, relatively small amounts of other aromatic tetracarboxylic dianhydrides and/or diamine compounds may be added, provided that no essential change of characteristics such as heat-resistance and thermoplastic property is brought about in the obtainable low Tg polyimide. Examples of the optionally employable aromatic tetracarboxylic dianhydrides include 3,3',4,4'-biphenyltetracarboxylic dianhydride, 2,2-bis(3,4-dicarboxyphenyl)propane dianhydride, and 2,3,6,7-naphthalenetetracarboxylic dianhydride.

Examples of the optionally employable diamine compounds include aromatic diamines which have a flexible molecular structure and contain plural benzene rings, such as 4,4'-diaminodiphenyl ether, 4,4'-diaminobenzophenone, 4,4'-diaminodiphenylmethane, 2,2-bis(4-aminophenyl)propane, 1,4-bis(4-aminophenoxy)benzene, 4,4'bis(4-aminophenyl)diphenyl ether, 4,4'-bis(4-aminophenyl)diphenylmethane, 4,4'-bis(4-aminophenoxy)diphenyl ether, 4,4'-bis(4-aminophenoxy)diphenylmethane, 2,2-bis[4-(aminophenoxy)phenyl]propane, and 2,2-bis[4-(4-aminophenoxy)phenyl]hexafluoropropane; aliphatic amines, such as 1,4-diaminobutane, 1,6-diaminohexane, 1,8-diaminooctane, 1,4-diaminodecane, and 1,12-diaminododecane; and diaminosiloxanes, such as bis(3-aminopropyl)tetramethyldisiloxane. The optionally employable aromatic diamine compound can be employed in an amount of 20 mol. % or less, particularly 10 mol. % or less, per the total amount of the diamine compounds. The optionally employable aliphatic diamine or diaminosiloxane can be employed in an amount of 20 mol. % or less, per the total amount of the diamine compounds. If the optionally employable diamine compound is incorporated in an amount exceeding the above-mentioned upper limit, the heat-resistance of the resulting polyimide may become unsatisfactorily low.

In the preparation of the low Tg polyimide, a dicarboxylic anhydride such as phthalic anhydride or its derivative, hexahydrophthalic anhydride or its derivative, or succinic anhydride or its derivative can be incorporated so as to cap the amine terminal of the resulting aromatic polyimide.

Each of the high Tg polyimide and the low Tg polyimide can be prepared from a corresponding polyamide acid (or polyamic acid), which is synthesized by a reaction of an aromatic tetracarboxylic anhydride and a diamine in the following manner.

The reactive compounds, i.e., an aromatic tetracarboxylic dianhydride and a diamine compound, are caused to react in an organic solvent at a temperature of approximately 100° C. or lower, preferably at a temperature of 20 to 60° C., so as to produce a polyamide acid, namely, a polyimide precursor. The polyamide acid solution or its diluted solution is employed as a dope for coating on a temporary support to form a dope film on the support. The dope solution preferably contains the polyamide acid in an amount of 1 to 20 wt. %. The dope film is heated to a temperature of 50 to 400° C. for 1 to 30 min., so as to evaporate the solvent and further produce a corresponding polyimide film by way of cyclization reaction.

Alternatively, the thermoplastic polyimide layer can be formed using a solution of thermoplastic polyimide which is produced by heating the polyamide acid at a temperature of 150 to 250° C., or heating the polyamide acid at a temperature of lower than 150° C., particularly 15 to 50° C., in the presence of a imidizing agent, to give the desired polyimide in the solution; removing the solvent by evaporation or precipitating the polyimide in a bad solvent, to give a polyimide powder; and then dissolving the polyimide powder in an appropriate solvent.

In the preparation of the polyamide acid, the diamine compound and the carboxylic anhydride compound (which includes a tetracarboxylic dianhydride and a dicarboxylic anhydride) are used in a molar ratio of 0.92:1 to 1.1:1, particularly 0.98:1 to 1.1:1, more particularly 0.99:1 to 1.1:1 in terms of a molar amount of the amino group and a molar amount of the carboxylic anhydride (i.e., a molar amount of the tetracarboxylic dianhydride, and a molar amount of the dicarboxylic anhydride, if it is used in combination). The dicarboxylic anhydride is preferably employed in a molar amount of 0.05 or less, based of one molar amount of the tetracarboxylic dianhydride.

Further, a gelation-inhibiting agent such as a phosphorus-containing stabilizer (e.g., triphenyl phosphite, or triphenyl phosphate) may be employed in the process of polymerization of the polyamide acid in an amount of 0.01 to 1% based on the amount of the polyamide acid. An imidizing agent such as a basic organic catalyst (e.g., imidazole, 2-imidazole, 1,2-dimethylimidazole, or 2-phenylimidazole) may be also added to the dope (i.e., polyamide acid solution) in an amount of 0.05 to 10 wt. %, particularly 0.1 to 2 wt. %, based on the amount of the polyamide acid. The imidizing agent is effective to well imidize the polyamide acid at a relatively low temperature.

In addition, a metal compound such as an organic aluminum compound (e.g., aluminum triacetylacetonate), an inorganic aluminum compound (e.g., aluminum hydroxide), or an organic tin compound may be incorporated into the dope in an amount of 1 ppm or more (in terms of the amount of metal), particularly 1 to 1,000 ppm, based on the amount of the polyamide acid, so that the thermoplastic polyimide layer can be bonded to a metal film at a higher bonding strength.

The preparation of the polyamide acid can be performed in an organic solvent such as N-methyl-2-pyrollidone, N,N-dimethylformamide, N,N-dimethylacetamide, N,N-diethylacetamide, dimethylsulfoxide, hexamethylphosphoramide, N-methylcaprolactam, or cresol or its derivative. The organic solvents can be employed singly or in combination.

The multi-layered aromatic polyimide film of the invention can be advantageously produced by the known co-extrusion/cast method, in which one or two solutions of a precursor of the low Tg polyimide and a solution of the high Tg polyimide are simultaneously extruded from a dye having plural slits and overlaid one on another on a temporary support such as a continuous metal belt. The overlaid solution films are dried and then heated to produce the desired multi-layered film having a combination of the high Tg polyimide layer and the low Tg polyimide layer, or a combination of the low Tg polyimide layer, the high Tg polyimide and the low Tg polyimide layer.

Alternatively, the multi-layered polyimide film can be produced by placing a semi-dried solution film of a precursor of the low Tg polyimide on a semi-dried solution film of a precursor of the high Tg polyimide and heating the semi-dried films to give the desired multi-layered polyimide film.

For the preparation of the metal film/polyimide film laminate according to the invention, the metal film and the aromatic polyimide film can be combined by heating a composite structure of the metal film and polyimide film under pressure, by any one of the conventional methods such as roll lamination and double belt press lamination. Generally, a combination of one or a pair of continuous metal film(s) and a continuous aromatic polyimide film is utilized to manufacture a continuous metal film/polyimide film laminate or a continuous metal film/polyimide film/metal film laminate. The resulting laminate preferably has a width of 400 mm or more, more preferably 500 mm or more, and preferably has a high bonding strength between the polyimide film and the metal film, such as 0.7 kg/cm or more (90° peel strength), preferably 1 kg/cm or more.

A known double belt press is preferably employed for the procedure of pressing under heating. A representative double belt press is described in U.S. Pat. No. 4,599,128, and is commercially available from Held Corporation (Germany).

Alternatively, the metal film can be formed by chemical plating or vacuum deposition of metal on the aromatic polyimide-film. The known plasma discharge deposition and sputtering can be also utilized. The electron beam deposition is also employable.

For performing the vacuum deposition, the pressure preferably is in the range of $10^{-7}$ to $10^{-2}$ torr, and the deposition rate preferably is in the range of 50 to 5,000 angstroms/sec. The polyimide film is preferably kept at a temperature of 20 to 600° C.

For performing the sputtering, a RF magnet sputtering method is preferably utilized, at a pressure of 1 torr or less, particularly in the range of $10^{-3}$ to $10^{-2}$ torr. The polyimide film is preferably kept at 20 to 450° C., and the rate of producing the metal layer is preferably adjusted to become in the range of 0.5 to 500 angstroms/sec.

For performing the chemical plating, copper, copper alloy, aluminum or palladium is favorably employed. Otherwise, chromium, titanium, nickel, molybdenum, tin, zinc, or palladium is employed as a subbing layer (thickness: 1 μm or less), and copper, copper alloy (e.g., Co—Ni), or silver can be plated on the subbing layer. The chemical plating can be electrolytic plating or non-electrolytic plating.

The polyimide film of the metal film/polyimide film laminate of the invention is subjected to laser etching, namely, application of a laser beam for removal of a portion of the polyimide layer, by a known method utilizing a known apparatus. A laser beam emitted from $CO_2$ laser or YAG laser which emits a laser beam in the infrared region or from a non-linear optical crystal which emits a laser beam in the UV region (260 to 400 nm) can be employed.

The polyimide film of the invention is favorably employable for producing a through-hole having a relatively small diameter such as approx. 3 to 300 μm, particulaly, approx. 30 to 300 μm, more particularly approx. 50 to 100 μm. The through-hole which is produced in the polyimide film of the invention generally is a cylindrical hole in which a ratio of the diameter on the upper side (formed on the surface to which the laser beam has been applied) to the diameter on the lower side is 1.5 or less, particularly 1.3 or less, namely, in the range of 1.5/1 to 1/1 (upper/lower). Thus produced through-hole is then subjected to the known desmear processing.

The polyimide film/metal film laminate of the invention is subsequently subjected to a procedure for forming a predetermined metal pattern on the polyimide film.

The through-hole is then subjected to chemical plating such as electrolytic plating or non-electrolytic plating, for placing a metal film on the inner surface of the through-hole. The chemical plating can be carried out, for instance, using an acidic bath containing 50 to 200 g/L (particularly 50 to 100 g/L) of a metal salt such as copper sulfate, 100 to 300 g/L of sulfuric acid, and a small amount of a brightener. The plating can be conducted under airy stirring at a temperature of 20 to 30° C., a cathode current density of 2 to 8 A/dm², a cathode efficiency of 95 to 100%, a anode/cathode area ratio of 1:1, at a voltage of 6 V or lower. The cathode is preferably made of a copper roll. The continuous filtering is preferred.

The polyimide film/metal laminate having thus plated through-hole is favorably employable as a FPC for COF use, TAB for package use, and a base substrate for manufacturing a multi-layer substrates.

The invention is further described by the following examples.

In the following examples, the physical characteristics were determined by the methods described below:

Tensile modules: ASTM-D882 (in the machine direction: MD)

Glass transition temperature (Tg): determined utilizing viscoelasticity data.

[Preparation of Three-layered Aromatic Polyimide Film]

(1) Preparation of S-dope for High Tg Polyimide

In a reaction vessel equipped with a stirrer and a nitrogen gas inlet were successively placed N-methyl-2-pyrrolidone, p-phenylenediamine (PPD) and 3,3',4,4'-biphenyltetracarboxylic dianhydride (s-BPDA) [1000:998, molar ratio of PPD/s-BPDA, so as to prepare a N-methyl-2-pyrrolidone solution containing 18 wt. % of a mixture of PPD and s-BPDA. The resulting mixture was kept at 50° C. for 3 hours, to give an S-dope (polyamide acid solution) having a solution viscosity of approx. 1,500 poise (at 25° C.).

(2) Preparation of K-dope for High Tg Polyimide

The procedures of (1) above were repeated except that s-BPDA was replaced with pyromellitic dianhydride and PPD was replaced with 4,4'-diaminodiphenyl ether (DADE), to give a K-dope (polyamide acid solution).

(3) Preparation of A-dope for Low Tg Polyimide

In a reaction vessel equipped with a stirrer and a nitrogen gas inlet were successively placed N-methyl-2-pyrrolidone, 1,3-bis(4-aminophenoxy)benzene (TPE-R), and 2,3,3',4'-biphenyltetracarboxylic dianhydride (a-BPDA) [1000:1000, molar ratio of TPE-R/a-BPDA, so as to prepare a N-methyl-2-pyrrolidone solution containing 22 wt. % of a mixture of TPE-R and a-BPDA. Further, triphenyl phosphate was added to the solution in an amount of 0.1% based on the amount of the mixture. The resulting mixture was kept at 25° C. for one hour, to give an A-dope (polyamide acid solution) having a solution viscosity of approx. 2,000 poise (at 25° C.).

(4) Preparation of B-dope for Low Tg Polyimide

The procedures of (3) above were repeated except that a-BPDA was replaced with s-BPDA and TPE-R was replaced with DADE, to give a B-dope (polyamide acid solution).

EXAMPLES 1 and 2 and

Comparison Example 1

One of the dopes for high Tg polyimide and one of the dope for low Tg polyimide were simultaneously extruded onto a continuous metal belt from a manifold die having three slits under the condition that both dopes were extruded to give a three-layered structure of dope for low Tg polyimide/dope for high Tg polyimide/dope for low Tg polyimide. The resulting dope solution films were continuously dried by air (heated to 140° C.), until the solution films were solidified and united. The united films were separated from the metal belt and heated in a heating furnace at gradually increased temperatures of 200° C. to 320° C. In the course of heating, the solvent was evaporated and imidization was performed. Thus produced continuous three-layered polyimide film having a width of approx. 530 mm was wound around a roll.

(1) Polyimide film of Example 1 (A/S/A) Thickness: 4 μm (A)/17 μm (S)/4 μm (A) Total thickness: 25 μm Tg of the low Tg polyimide layer: 250° C.

(2) Polyimide film of Example 2 (B/S/B) Thickness: 1 μm (B)/23 μm (S)/1 μm (B) Total thickness: 25 μm Tg of the low Tg polyimide layer: 275° C.

(3) Polyimide film of Comparison Example 1 (A/K/A) Thickness: 4 μm (A)/17 μm (K)/4 μm (A) Total thickness: 25 μm Tg of the low Tg polyimide layer: 250° C.

EXAMPLE 3

The polyimide film of Example 1 were placed between a pair of electrolytic copper films (thickness: 12 μm, available from Mitsui Metal Mining Co., Ltd). Thus formed composite structure was placed on an in-line attached to the front of a double belt press and pre-heated for 30 seconds by a hot air of 200° C. The pre-heated structure was then continuously supplied into the double belt press. In the double belt press, the composite structure (copper film/polyimide film/copper film) was continuously pressed first at 351° C. (maximum heating temperature) and then at 117° C. (lowest temperature), to give a combined copper film/polyimide film/copper film laminate having a width of approx. 530 mm.

The copper film/polyimide film/copper film laminate was chemically etched by a conventional procedure to remove one copper film, and then subjected to a laser beam-etching using a commercially available etching apparatus (Impact Laser GS 500, TEA-$CO_2$ laser, available from Sumitomo Heavy Industry Co., Ltd) under the following conditions:

Via-holes: 50 μm and 100 μm

Number of Shots: 6 shots each

Out-put: 23.1 W, 150 Hz

Energy: 13.3 $J/cm^2$

The through-holes produced on the polyimide film had a section similar to that illustrated in FIG. 2-(1). The diameter on the upper surface and the diameter on the lower surface were essentially the same. In more detail, a ratio of diameter on the upper surface to diameter on the lower surface was 1.3 for the 50 μm-hole and 1.15 for 100 μm-hole.

The polyimide film having the through-holes were subjected to desmear processing using an aqueous permanganate acid solution, and the inner surface of the through-holes were electrolytically plated with copper. Subsequently, a fine pattern was produced in the copper film attached on the polyimide film.

EXAMPLE 4

Both surface of the polyimide film of Example 2 were subjected to vacuum plasma discharge treatment. On thus treated surfaces, copper was vacuum deposited and electrically plated, to form a plated copper layer of 5 μm thick on each surface of the polyimide film.

The plated polyimide film was subjected to laser etching in the same manner as in Example 3. The produced through-holes had good conditions similar to those of Example 3.

Comparison Example 2

The procedures of Example 3 were repeated except for using the polyimide film of Comparison Example 1 in place of the polyimide film of Example 1, to give a combined copper film/polyimide film/copper film laminate having a width of approx. 530 mm.

The polyimide film was then subjected to laser etching in the same manner as in Example 3. The produced through-holes had uneven inner surface.

What is claimed is:

1. In a method of producing a through-hole in an aromatic polyimide film having on a surface thereof a laminated or deposited metal film by applying laser beam onto the polyimide film, the improvement in that the polyimide film comprises a high Tg aromatic polyimide layer which has a glass transition temperature of 300° C. or higher or has no noticeable glass transition temperature and is produced from a biphenyltetracarboxylic acid compound and an aromatic diamine compound and a low Tg aromatic polyimide layer which has a glass transition temperature of lower than 375° C. but higher than 200° C., provided that the glass transition temperature of the low Tg polyimide layer is lower than the glass transition temperature of the high Tg polyimide layer and the metal film is laminated or deposited on the surface of the low Tg aromatic polyimide layer on the side not facing the high Tg aromatic polyimide layer.

2. The method of claim 1, wherein the high Tg aromatic polyimide layer is produced from one of the following combinations:

3,3',4,4'-biphenyltetracarboxylic dianhydride and p-phenylenediamine;

3,3',4,4'-biphenyltetracarboxylic dianhydride and a combination of p-phenylenediamine and 4,4'-diaminodiphenyl ether;

a combination of 3,3',4,4'-biphenyltetracarboxylic dianhydride and pyromellitic dianhydride and p-phenylenediamine, provided that the ratio of the former dianhydride to the latter dianhydride is 15/85 or more; and a combination of 3,3',4,4'-biphenyltetracarboxylic dianhydride and pyromellitic dianhydride and a combination of p-phenylenediamine and 4,4'-diaminodiphenyl ether, provided that the ratio of the former dianhydride to the latter dianhydride is 15/85 or more.

3. The method of claim 1, wherein the high Tg aromatic polyimide layer has a coefficient of linear expansion of $5\times10^{-6}$ to $25\times10^{-6}$ cm/cm/°C. in the temperature range of 50 to 200° C., in both a machine direction thereof and a traverse direction thereof.

4. The method of claim 1, wherein the low Tg aromatic polyimide layer has a glass transition temperature of 200 to 300° C.

5. The method of claim 1, wherein the low Tg aromatic polyimide layer is produced from one of the following combinations:

2,3,3',4-biphenyltetracarboxylic dianhydride and 1,3-bis(4-aminophenoxy)benzene;

4,4'-oxydiphthalic dianhydride and 1,3-bis(4-aminophenoxy)-2,2-dimethylpropane;

pyromellitic dianhydride and 1,3-bis(4-aminophenoxy)benzene;

3,3',4,4'-benzophenonetetracarboxylic dianhydride and 1,3-bis(3-aminophenoxy)benzene;

3,3',4,4'-benzophenonetetracarboxylic dianhydride and a combination of 3,3'-diaminobenzophenone and 1,3-bis(3-aminophenoxy)benzene; and 3,3',4,4'-biphenyltetracarboxylic dianhydride and 4,4'-diaminodiphenyl ether.

6. The method of claim 1, wherein the polyimide film has a thickness of 7 to 50 μm.

7. The method of claim 6, wherein the high Tg polyimide layer has a thickness of 55 to 99.9% of the thickness of the polyimide film.

8. The method of claim 1, wherein the metal film has a thickness of 1 to 18 μm.

9. The method of claim 8, wherein the metal film has a thickness of 3 to 12 μm.

10. The method of claim 1, wherein the metal film is laminated on the low Tg aromatic polyimide layer by pressing the metal film on the low Tg polyimide layer under heating.

11. The method of claim 10, wherein the metal film has a surface roughness in terms of Rz in the range of 0.5 to 3 μm.

12. The method of claim 1, wherein the metal film is deposited on the low Tg aromatic polyimide layer by vacuum deposition, electron beam deposition, sputtering, or chemical plating.

13. The method of claim 1, wherein the through-hole has a diameter of 3 to 300 μm.

14. The method of claim 1, wherein the glass transition temperature of the low Tg polyimide layer is lower than that of the high Tg polyimide layer by 10° C. or larger.

15. In a method of producing a through-hole in an aromatic polyimide film having on a surface thereof a laminated or deposited metal film by applying a laser beam onto the polyimide film, the improvement in that the polyimide film comprises a high Tg aromatic polyimide layer which has a glass transition temperature of 300° C. or higher or has no noticeable glass transition temperature and is produced from a biphenyltetracarboxylic acid compound and an aromatic diamine compound and two low Tg aromatic polyimide layers each of which has a glass transition temperature of lower than 375° C. but higher than 200° C., provided that the glass transition temperature of the low Tg polyimide layer is lower than the glass transition temperature of the high Tg polyimide layer and the high Tg polyimide layer is placed between the low Tg polyimide layers.

16. The method of claim 15, wherein the high Tg aromatic polyimide layer is produced from one of the following combinations:

3,3',4,4'-biphenyltetracarboxylic dianhydride and p-phenylenediamine;

3,3',4,4'-biphenyltetracarboxylic dianhydride and a combination of p-phenylenediamine and 4,4'-diaminodephenyl ether;

a combination of 3,3',4,4'-biphenyltetracarboxylic dianhydride and pyromellitic dianhydride and p-phenylenediamine, provided that the ratio of the former dianhydride to the latter dianhydride is 15/85 or more; and a combination of 3,3',4,4'-biphenyltetracarboxylic dianhydride and pyromellitic dianhydride and a combination of p-phenylenediamine and 4,4'-diaminodiphenyl ether, provided that the ratio of the former dianhydride to the latter dianhydride is 15/85 or more.

17. The method of claim 15, wherein the low Tg aromatic polyimide layer is produced from one of the following combinations:

2,3,3',4-biphenyltetracarboxylic dianhydride and 1,3-bis(4-aminophenoxy)benzene;

4,4'-oxydiphthalic dianhydride and 1,3-bis(4-aminophenoxy)-2,2-dimethylpropane;

pyromellitic dianhydride and 1,3-bis(4-aminophenoxy)benzene;

3,3',4,4'-benzophenonetetracarboxylic dianhydride and 1,3-bis(3-aminophenoxy)benzene; and 3,3',4,4'-biphenyltetracarboxylic dianhydride and a combination of 3,3'-diaminobenzophenone and 1,3-bis(3-aminophenoxy)benzene.

18. The method of claim 15, wherein the polyimide film has a thickness of 7 to 50 μm, and the high Tg polyimide layer has a thickness of 55 to 99.9% of the thickness of the polyimide film.

* * * * *